(12) United States Patent
Ruf et al.

(10) Patent No.: US 7,760,569 B2
(45) Date of Patent: Jul. 20, 2010

(54) SEMICONDUCTOR MEMORY DEVICE WITH TEMPERATURE CONTROL

(75) Inventors: Wolfgang Ruf, Friedberg (DE); Martin Schnell, Xi'an (CN); Rainer Kömmling, Gilching (DE)

(73) Assignee: Qimonda AG, Munich (DE)

( * ) Notice: Subject to any disclaimer, the term of this patent is extended or adjusted under 35 U.S.C. 154(b) by 442 days.

(21) Appl. No.: 11/696,777

(22) Filed: Apr. 5, 2007

(65) Prior Publication Data

US 2008/0247252 A1  Oct. 9, 2008

(51) Int. Cl.
    *G11C 7/04*  (2006.01)
(52) U.S. Cl. .................... 365/211; 365/233.1; 365/226; 365/242
(58) Field of Classification Search ................. 365/211, 365/212, 213, 242, 233.1, 226
    See application file for complete search history.

(56) References Cited

U.S. PATENT DOCUMENTS

| 6,775,196 | B2 * | 8/2004 | Perner et al. ................ 365/211 |
| 7,272,063 | B1 * | 9/2007 | Egerer et al. ................ 365/212 |
| 7,313,044 | B2 * | 12/2007 | Fuhrmann et al. ........... 365/211 |
| 7,554,869 | B2 * | 6/2009 | Kim et al. ................... 365/211 |

* cited by examiner

*Primary Examiner*—Pho M. Luu
(74) *Attorney, Agent, or Firm*—Edell, Shapiro & Finnan, LLC (57) ABSTRACT

A memory device in a semiconductor substrate includes at least one temperature sensor to provide a temperature dependent signal and at least one circuit to dissipate heat in response to a control signal. A control circuit is coupled to the at least one circuit and is operable to generate the control signal in response to the temperature dependent signal.

20 Claims, 7 Drawing Sheets

SEMICONDUCTOR MEMORY DEVICE WITH TEMPERATURE CONTROL

BACKGROUND

Electronic devices include processors that switch to "sleep"-mode (e.g., digital cameras, camcorders, mp3-players, mobile CD or DVD players, mobile communication devices, notebook computers, palmtops, mobile storage devices, etc.) During sleep mode and low power consumption, the semiconductor substrate and the memory device of the electronic device may cool down because of the lack of heat dissipation due to reduction in power consumption. In cold environments, the integrated memory device and components of the memory device will cool down significantly faster and sometimes below a lower threshold temperature which is required to ensure an undisturbed and failure-free operation of the integrated memory device. In addition, sense amplifiers may be sensitive to temperature of the environment and have to be implemented in a different way when operating at low temperature compared to an operation at higher temperatures. Likewise, some generators, pumps or control logic blocks may fail due to a higher resistance due to the low temperature. Oscillators in the central circuits like DLL or the controller blocks are used to control internal timings and to generate clock signals. At low temperatures of the semiconductor substrate, this circuitry may fail to resonate, thereby setting the integrated memory device to an unstable operation. Consequently, the different circuits have to operate not only at room or even higher temperatures but also at low temperatures. Therefore, a semiconductor memory with an improved temperature control is desired.

SUMMARY

Described herein is a memory device in a semiconductor substrate including at least one temperature sensor to provide a temperature dependent signal and at least one circuit to produce and dissipate heat in response to a control signal. A control circuit is coupled to the at least one circuit and is operable to generate the control signal in response to the temperature dependent signal.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
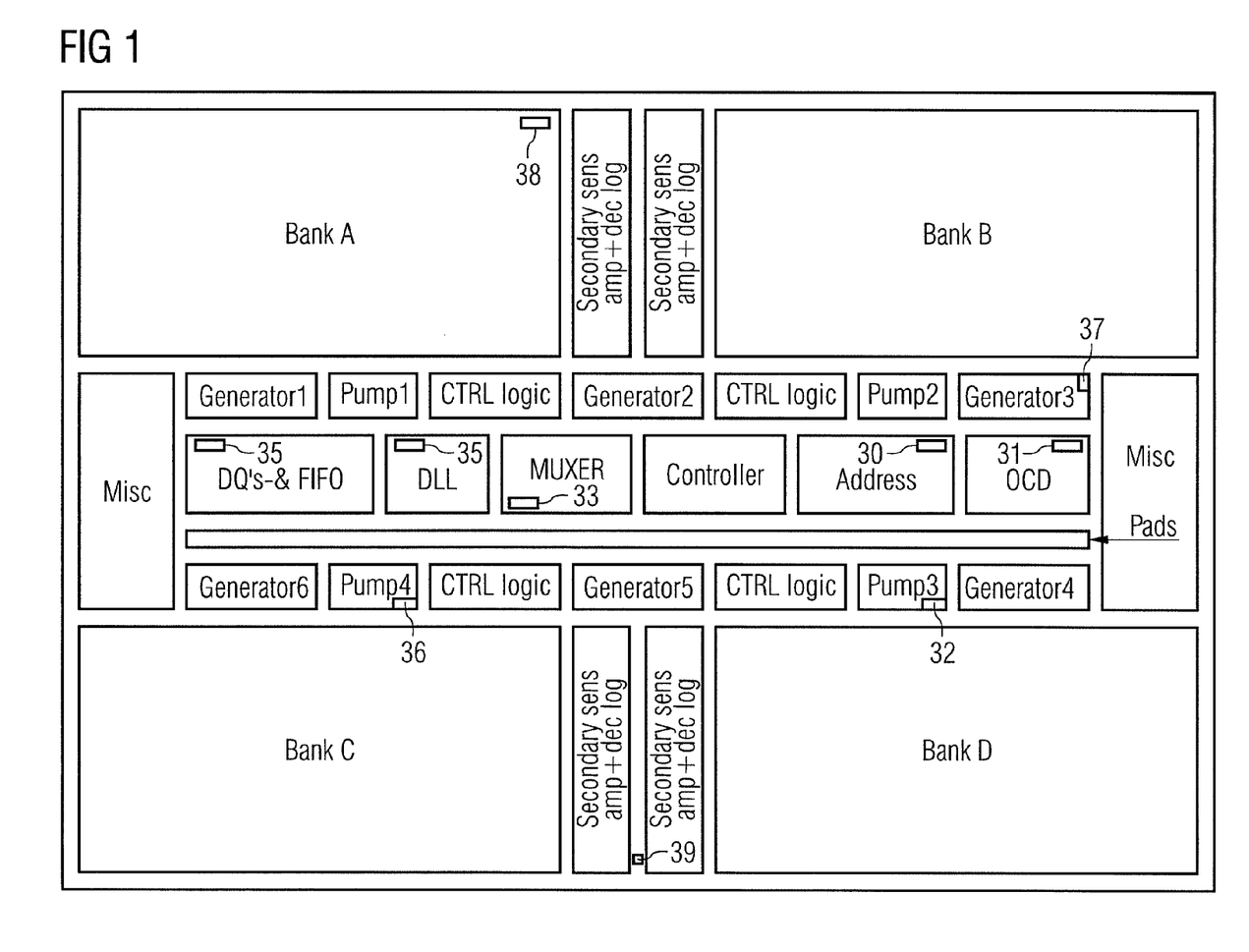
FIG. 1 illustrates a first embodiment of an integrated memory in a semiconductor substrate.

FIG. 1 shows an embodiment of an integrated memory device as an integrated circuit in a semiconductor substrate. The semiconductor substrate may comprise silicon, gallium arsenide or any other semiconductor material. The integrated memory device can be grouped in different sections of circuit blocks, each of them comprising one or more sub-circuits performing different operations. For example, secondary sense amplifiers for the respective main memory bank A to bank D are grouped together in a circuit block. The secondary sense amplifier may comprise not only sense amplifiers but also decoder logic, like for example row and address decoder. The circuits performing the same or similar operations may also be arranged in a section of the semiconductor substrate and the integrated memory device.

In this embodiment of an integrated memory device, the circuit block with the secondary sense amplifier and the decoder logic is assigned to a corresponding memory block Bank A to Bank D, respectively. The memory blocks Bank A to Bank D each comprise a plurality of word line and bit lines connected to row and address decoders not shown herein for illustration purposes. The memory banks also comprise a plurality of memory cells, for example, a DRAM memory cell with a deep trench capacitor. The memory cells are arranged in nodes between the word lines and the corresponding bit lines.

The address and row decoders as well as the sense amplifiers of each memory blocks Bank A, B, C and D require a supply voltage and current. Other signals with different and even higher voltages than the supply voltage are required to generate control signals for different operation modes of the integrated memory device. For this purpose, the integrated memory device comprises a plurality of generator circuits, pump circuits and control circuitry assigned to the memory banks.

The generator circuitry is arranged in corresponding generator circuit blocks Generator 1 to Generator 6. The generator circuit block may comprise different sub-circuits like, for example, voltage regulator circuits and voltage divider circuits. The pump circuitry assigned to one of the four memory blocks Bank A to Bank D is arranged in corresponding pump circuits blocks Pump 1 to Pump 4. The pump circuit blocks may comprise one or more pump circuits used to generate higher output voltages compared to an internal supply voltage. A control logic block CTRL logic comprising the control circuitry is also provided for each of the memory blocks Bank A to Bank D. The control logic blocks CTRL logic assigned to the corresponding memory blocks Bank A to Bank D generate the control signals for the address decoders, the multiplexers, the sense amplifiers and the decoder logic. They may also control the circuits of the generator circuit blocks and the pump circuit blocks.

Depending on the mode of operation, different circuits in each of the various circuit blocks are active while other not required for this operation are deactivated to reduce power consumption. For example, in a refresh of the memory cells in each memory block Bank A to Bank D, some sub-circuits of the generator blocks, the pump blocks as well as the control logic blocks generate corresponding signals to drive the sense amplifiers and the switching transistors within the memory blocks Bank A, B, C and D of the integrated memory device.

In this embodiment, the generator blocks Generator 2 and Generator 5 comprise sub-circuits, which are used to generate corresponding signals for two of the memory blocks Bank A, B and Bank C, D. While some of the circuit blocks are assigned to specific memory banks, a further central section of the integrated memory device is provided in which circuits are incorporated used in operation for each of the memory blocks. In other words, some circuitry provides central functionality. This circuitry is also grouped together and arranged in this embodiment in a central section of the semiconductor substrate. For example, the circuit block DLL comprises circuitry for generating different clock signals. These clock signals are used throughout the integrated memory device as a time base. A central controller block Controller as well as an address block Address is disposed in the central section to provide overall control and address signals used in each of the memory banks. Multiplexing and de-multiplexing circuitry for splitting up the data to be stored in the memory blocks Bank A to Bank D is arranged in a circuit block MUXER. Data queues DQ's and FIFO buffer blocks as well as an OCD block are also provided.

In this embodiment, the different memory blocks A, B, C and D of the integrated memory device are arranged in the outer region of the semiconductor substrate while the circuitry for addressing and operating the memory blocks are arranged in a central section of the semiconductor body.

In operation, the integrated memory device generates a plurality of internal supply voltages and supply currents independently of each other. Voltage and current which are higher than an external supply voltage or below ground potential are generated by the circuitry arranged in the pump circuit blocks Pump 1 to Pump 4. The different supply voltages, currents and signals are used for different operation modes like, for example, refresh cycles or reading and writing into memory cells of the memory blocks A to D.

When activating the integrated memory device, the circuitry of the generator circuit blocks Generator 1 to Generator 6 as well as the pump and control logic blocks Pump and CTRL logic may be powered up in a specific order. This is because some pump circuitry receives supply current and voltage by some generator circuitry. The CTRL logic circuitry uses internally generated signals. As soon as the different circuits are powered up correctly, a corresponding "boot success signal" is generated and the integrated memory device is set to an operation mode. If one of the circuit blocks does not power up correctly, a "boot fail signal" will be generated. The circuit block then may repeat the power up procedure or the integrated memory device may signalize a boot failure.

In several operation modes of the integrated memory device, some circuitry of the different circuit blocks or even some circuit blocks will switch to a "sleep mode", wherein power consumption is significantly reduced. For example, if no refresh, read or write cycle for the memory blocks are required, the some generator circuitry and the pump circuitry can be deactivated to reduce the overall power consumption. It can be even possible to switch off total circuit blocks like for example the pump circuit blocks Pump 1 to Pump 4 and the clock signal circuitry generating the clock signals for the pump circuit blocks.

During sleep mode and low power consumption, the semiconductor substrate and the memory device may cool down because the heat dissipation due to increased power consumption is reduced. In cold environments, the integrated memory device will cool down significantly faster and sometimes below a lower threshold temperature which is required to ensure an undisturbed and failure-free operation of the integrated memory device. Consequently, the different circuits have to operate not only at room or even higher temperatures but also at low temperatures.

However, sense amplifiers may be sensitive to environment temperature and have to be implemented in a different way when operating at low temperature compared to an operation at higher temperatures. In addition, some generator, pump or control logic blocks may fail due to a higher resistance because of the low temperature. Oscillators in the central circuits like DLL or the controller block are used to control internal timings and to generate clock signals. At low temperatures of the semiconductor substrate, this circuitry may fail to resonate, thereby setting the integrated memory device to an unstable operation.

To measure the temperature of the integrated memory device within the semiconductor substrate in different modes of operation, a plurality of temperature sensors in different sections throughout the substrate is disposed. In the embodiment according to FIG. 1, the temperature sensors 31 to 37 are arranged in different regions and sections near temperature sensitive circuitry or circuit blocks. For instance, temperature sensors 32, 36 and 37 are arranged in generator or pump circuit blocks Pump 3, Pump 4 and Generator 3. Other temperature sensors are disposed near the secondary sense amplifier block including decoder logic or the memory blocks or in the central circuit blocks.

They may be arranged near critical circuitry of the corresponding circuit blocks used in different modes of operation. If, for example, the circuit block DLL comprises sub-circuits generating general purpose clock signals, a corresponding temperature sensor 34 is arranged nearby to ensure that a temperature of the semiconductor substrate close to low threshold temperature is duly indicated.

Depending on the measured temperature of the temperature sensors 31 to 39, different actions can be taken. If the temperature of the semiconductor substrate due to a low power mode of the integrated memory device drops below a low threshold value, proper measures are performed to increase the temperature of the semiconductor substrate. In other words, if the temperature drops below a predefined threshold value, heat is produced and dissipated to increase the temperature of the semiconductor body.

Heat dissipation and increasing the temperature can be implemented in various ways. For instance, some circuitry or circuit blocks, which are in a power-safe mode are reactivated, thereby increasing the overall power consumption but also dissipating heat to increase the temperature of the substrate. It is also possible to start a self-refresh procedure of the memory banks activating generator and pump circuitry as well as the control logic and the secondary sense amplifier block including decoder logic circuitry. This procedure may also produce heat and increase the overall temperature. Furthermore, it is possible to add some additional heat dissipating resistors within the semiconductor body. A current is sent through the heat resistors, warming them up and producing some heat, thereby increasing the temperature of the semiconductor substrate. The heat resistors can be arranged in critical areas where a minimum temperature is required to power up the corresponding circuitry of the integrated memory device.

Figure 2:
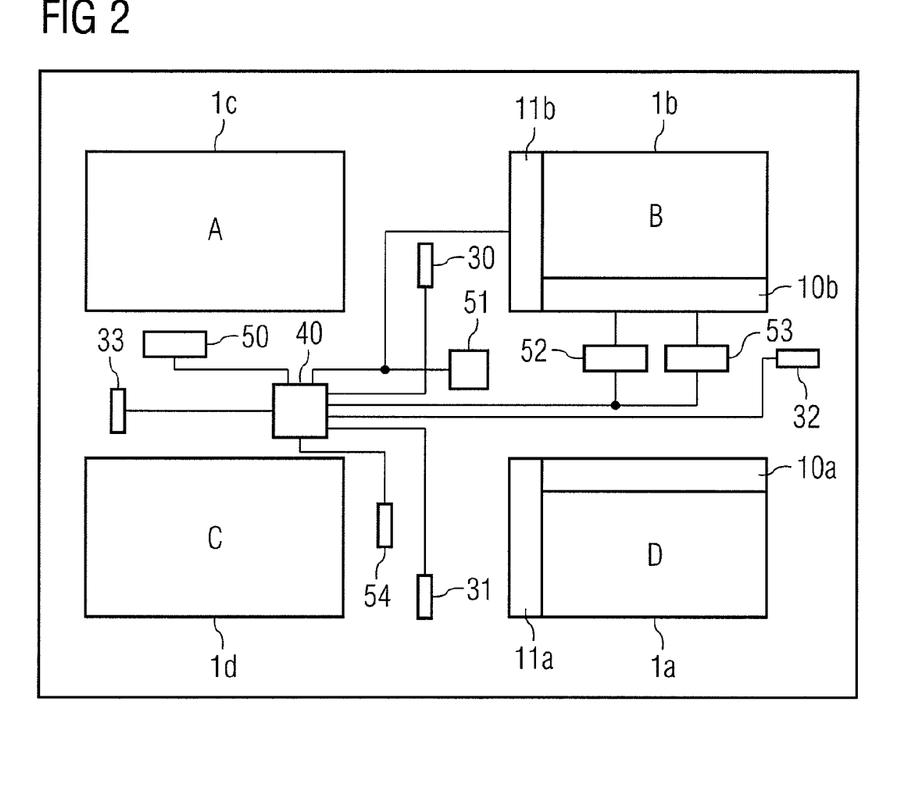
FIG. 2 illustrates a second embodiment of an integrated memory with a temperature control circuit in a semiconductor substrate.

FIG. 2 shows further embodiments of an integrated memory device in a semiconductor body having four different memory cell blocks 1a to 1d. Each of the memory cell blocks also comprises a word address decoder 10a, 10b, of which in this embodiment two are illustrated, as well as row decoders 11a and 11b. Word address and row decoder 10b and 11b of memory cell block 1b are controlled by corresponding control logic blocks, of which two 52 and 53 are shown herein. The control logic blocks 52 and 53 may also comprise generator sub-circuits and pump sub-circuits to generate the required logic level and supply voltages. Other circuit blocks are assigned to the memory cell blocks 1a, 1c and 1d.

Throughout the semiconductor body, a plurality of temperature sensors 30 to 33 is disposed. The temperature sensors are measuring the temperature in specific time intervals in different sections of the body. The signal corresponding to the measured temperature is applied to a control circuit 40 determining different actions to be taken in response to the measured temperature. In normal operation like, for example, reading or write cycles, the integrated memory device dissipates enough heat due to its higher power consumption to ensure a proper operation even at low environment temperatures.

If some logic operations are not required, the corresponding circuitry or even circuit blocks are deactivated and set to a "sleep-" or "power-down" mode. In these operation modes, the overall power consumption is significantly reduced and much less heat is produced and dissipated. The decreasing temperature is measured by the internal temperature sensors 30 to 33 and provided to the control circuit 40. The control circuit 40 compares the signals provided by the temperature sensors 30 to 33 with one or more reference signals. If such comparison indicates that the temperature drops below a threshold value which is required to ensure a proper operation of the integrated memory device, the controller 40 reactivates some circuitry or circuits blocks from the sleep mode. The reactivated circuitry may power up, thereby dissipating additional heat and increasing the overall temperature of the semiconductor substrate.

If, for example, the temperature sensor 32 indicates a temperature drop below the threshold value, the controller 40 reactivates the circuit blocks 52 and 53 requesting a refresh cycle of the corresponding memory bank 1b. This will increase the temperature in the section and also in other sections with some delay due to the thermal flow. If temperature sensor 30 indicates a low temperature, the address decoder 11b may be reactivated. Depending on the operation mode and control settings of control circuit 40, other circuitry and/or circuitry blocks can be reactivated as well. Reactivated circuitry may power up or generate some signals in order to generate heat.

In an alternative mode of operation, the circuit blocks 50 to 54 are reactivated by the controller 40 and a power-up signal indicating a correct activation is requested by the control circuit 40. If one or more circuit block indicates a boot failure, the circuit block may be reset and the power-up procedure repeated. The different heat dissipating measures are controlled by circuit 40. They are repeated and continued until the temperature increases above the threshold value or a second threshold value is reached.

Figure 3:
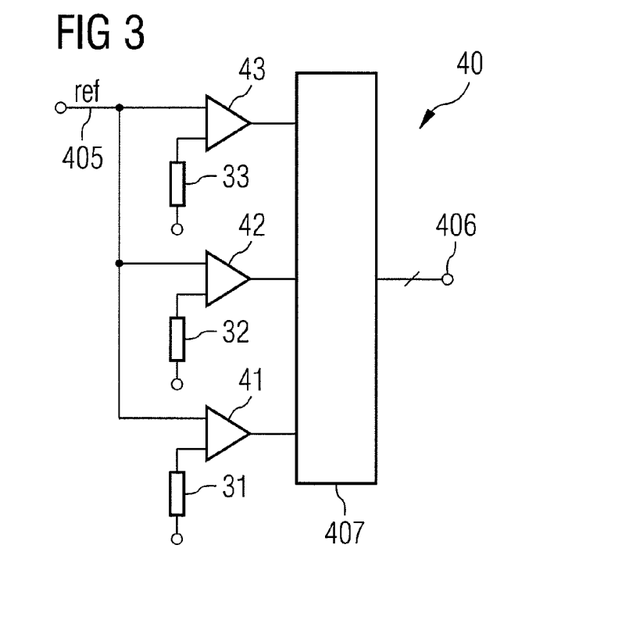
FIG. 3 illustrates an embodiment of a temperature control circuit for determining a temperature drop below a threshold value.

FIG. 3 shows a possible embodiment of a section of the control circuit 40 comprising three different comparator circuits 41, 42 and 43. Each of the comparator circuits 41 to 43 comprises an input terminal connected to a respective temperature sensor 31, 32 and 33. The signals provided by the temperature sensor may correspond to a temperature. They are compared with a reference signal ref provided at terminal 405. The comparators may provide a logic level at its output terminal, simply indicating above or below threshold, but also some analogue signal or a data word providing information about the difference of the signal by the temperature sensors and the reference signal ref. The output terminals of the respective comparators 41 to 43 are connected to a logic circuit 407 to generate a control word at terminal 406. The control word is applied to several circuits in order to take some heat dissipating actions. While in this embodiment a single reference signal will be used for each comparison, different reference signals are also possible.

Figure 4:
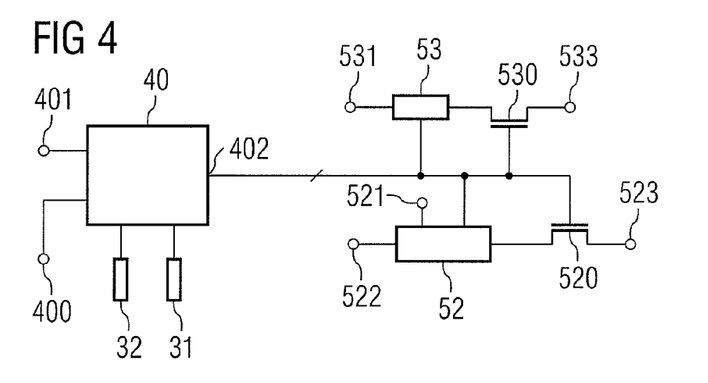
FIG. 4 illustrates a section of an integrated circuit showing a temperature control circuit and further circuit blocks of the integrated circuit connected thereto.

FIG. 4 shows a different embodiment of a temperature control circuit 40 within an integrated memory device. The control circuit 40 comprises an output terminal 402 for a data control word which is applied to different circuitry 52 and 53, respectively. The circuitry 52 and 53 are used to generate different logic or supply signals in various modes of operation. For example, the circuitry may comprise circuits used for generating internal supply voltages. Also, the circuitry may comprise pump circuits, or control logic circuits like an address or row decoder.

In this embodiment, the circuit block 52 comprises an address decoder with a terminal 521 on which an address word is applied. The address word is processed in the decoder to provide one or a plurality of address signals. The address decoder 52 is supplied by an internal supply voltage via the terminal 522. The generated address signals are provided at output terminal 523. A transistor switch 520 is disposed between terminal 523 and the circuit block 52. The gate of the transistor switch 520 is coupled to output terminal 402 of the controller circuit 40. The second circuitry 53 comprises some pump circuits and internal voltage regulators. The sub-circuits of circuitry 53 are also supplied by an internal voltage at terminal 531. While the pump circuits generate voltage signals higher than the internal supply voltage at terminal 531, the voltage regulators provide constant voltages lower than the internal voltage. One of those voltage signals is provided at terminal 533, coupled to circuitry 53 via the transistor switch 530. The gate of the transistor 530 is also connected to terminal 402.

In an operation mode, the circuitry 52 and 53 is set to a sleep mode, because no operation is required. The consumption is reduced and only small or even no heat is dissipated by the circuitry 52, 53. When a temperature drop below a minimum temperature threshold is indicated by the temperature sensors 31 and 32, corresponding control signals are generated by the controller circuit 40 and applied to the circuitry 52 and 53. The control signals will switch the circuitry 52 to 53 from a sleep mode or power-down mode to a power-up mode and active mode of operation. For this purpose, the internal circuits and sub-circuits are connected to the supply terminals 522 and 531, respectively. During the activation procedure, the power consumption of the circuitry 52 and 53, increases thereby dissipating heat resulting in a temperature increase.

At the same time, the control signals switch off the transistors 530 and 520. As a result, the signals generated by the circuitry 52 and 53 are prevented from being applied to terminals 523 and 533. The increasing temperature is measured by sensors 31, 32. If the temperature increase by the additional power consumption within the circuit blocks 52 and 53 is above the threshold value as indicated by the temperature sensors 31 and 32, the controller circuit 40 applies a power-down signal to the corresponding circuitry. The circuitry 52 and 53 will be set to the sleep mode again reducing power consumption.

Figure 5:
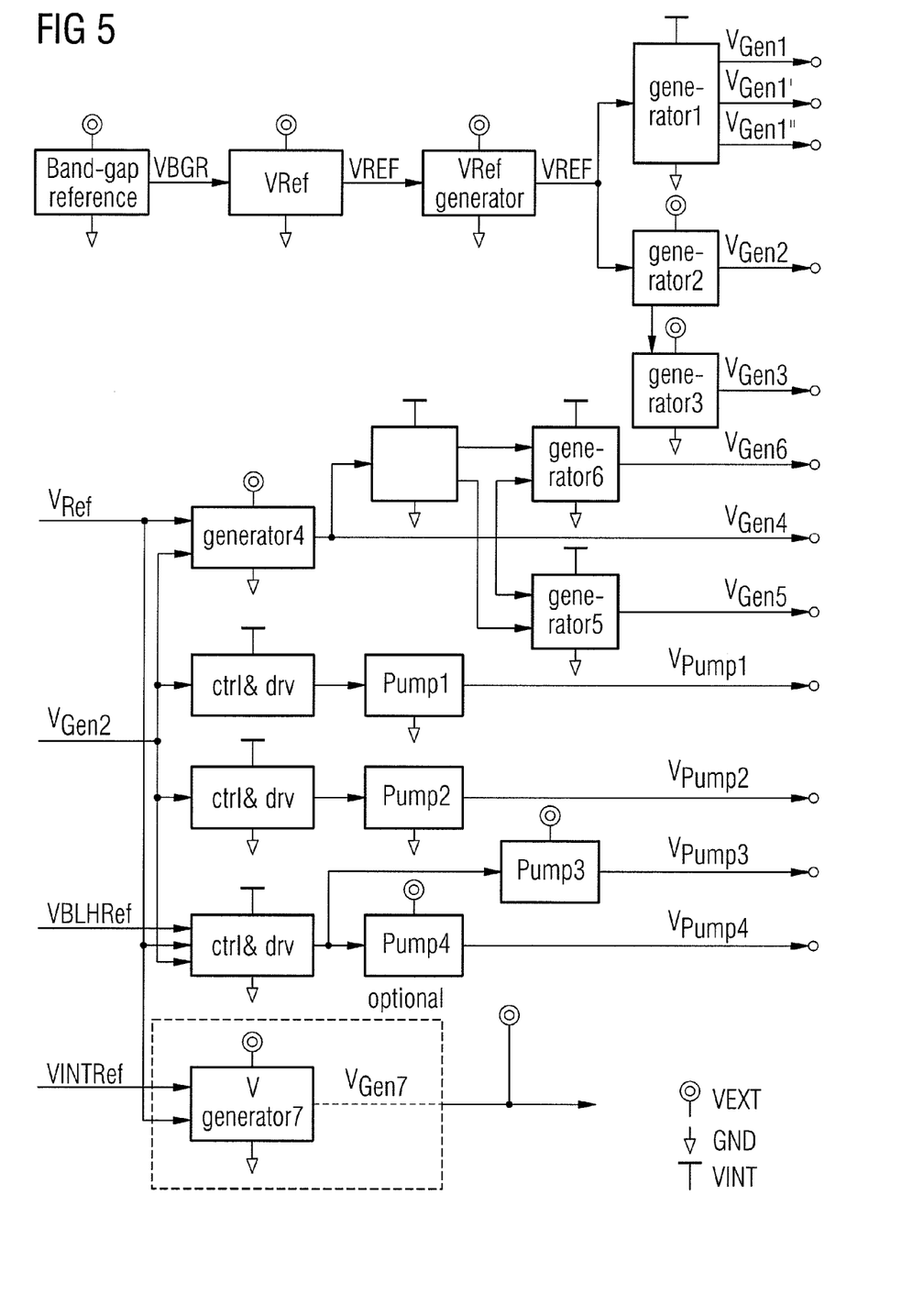
FIG. 5 illustrates an embodiment of different circuit blocks for generating different required voltages used in operation of an integrated memory device.

FIG. 5 shows an overview of a block diagram for an integrated memory circuit device with the different generator circuitry. A band gap reference circuit is used to generate a corresponding band gap voltage VBGR from which different other voltages like vREF and vREFDCS are derived. The internal voltage vINT generated by the internal generator vINTgenerator is then used to supply different other circuitry like the VBLEQ generator, the vPL generator, vNWLL, vBB and vPP. The internal voltage vINT is also used in several circuits VBLEQ and vPL for the generation of different signals and supply voltages. Pump circuits like the vNWLL PUMPS, and vBB PUMPS are activated to generate corresponding signals below a ground voltage. They are controlled by other circuits supplied by the internal supply voltage vINT.

As seen from FIG. 5, a plurality of different voltages and signals are required for an integrated memory device. Accordingly, the corresponding generator and pump circuits and circuit blocks have to be activated and deactivated in a specific order to ensure proper operation. Only if all generator blocks are generating a correct "power-up signal", the integrated memory device is set to a proper operation mode. While the "power-up signal" indicates a proper operation it can also be used to initialize a start up procedure of a circuit block connected downstream.

During low power mode or several sleep modes, some of the generators and pump circuits can be deactivated to reduce the overall power consumption. Nevertheless, the deactivated circuitry requires a minimum temperature to ensure a correct and failure free reactivation procedure. By measuring the temperature of the semiconductor body, several deactivated circuitry can be reactivated to increase the overall power consumption, thereby dissipating heat and increasing the temperature. While the total power consumption is still reduced this procedure leaves of the semiconductor substrate at a sufficient temperature. When activating an integrated memory device for the first time with a startup procedure, additional heat resistors can be used to bring the semiconductor body up to a minimum operation temperature.

Figure 6:
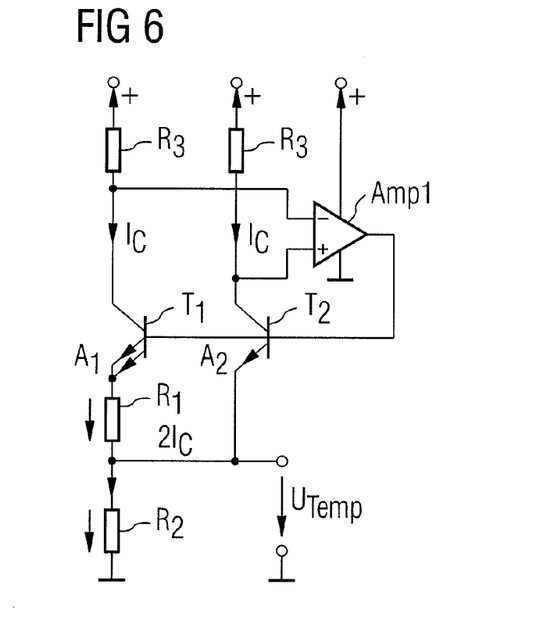
FIG. 6 illustrates an embodiment of a temperature sensor.

The temperature can be measured using different temperature sensors. For instance, resistance changes of a semiconductor material can be determined using a resistor with a semiconductor material. As an alternative, PTAT circuits can be implemented in the semiconductor substrate. An embodiment of a PTAT sensor, providing a signal proportional to absolute temperature is illustrated in FIG. 6. The sensor uses the difference of the base-emitter voltages of two bipolar transistors T1, T2 having different current densities. The different current densities are realized by different transistor areas A1 and A2, respectively. The gates of both transistors T1 and T2 are connected an operational amplifier, whose input terminals are coupled to the respective collector terminals of the transistors T1 and T2. The ratio of R1/R2 determines the voltage variation per temperature variation. The voltage UTemp is proportional of the absolute temperature.

Figure 7:
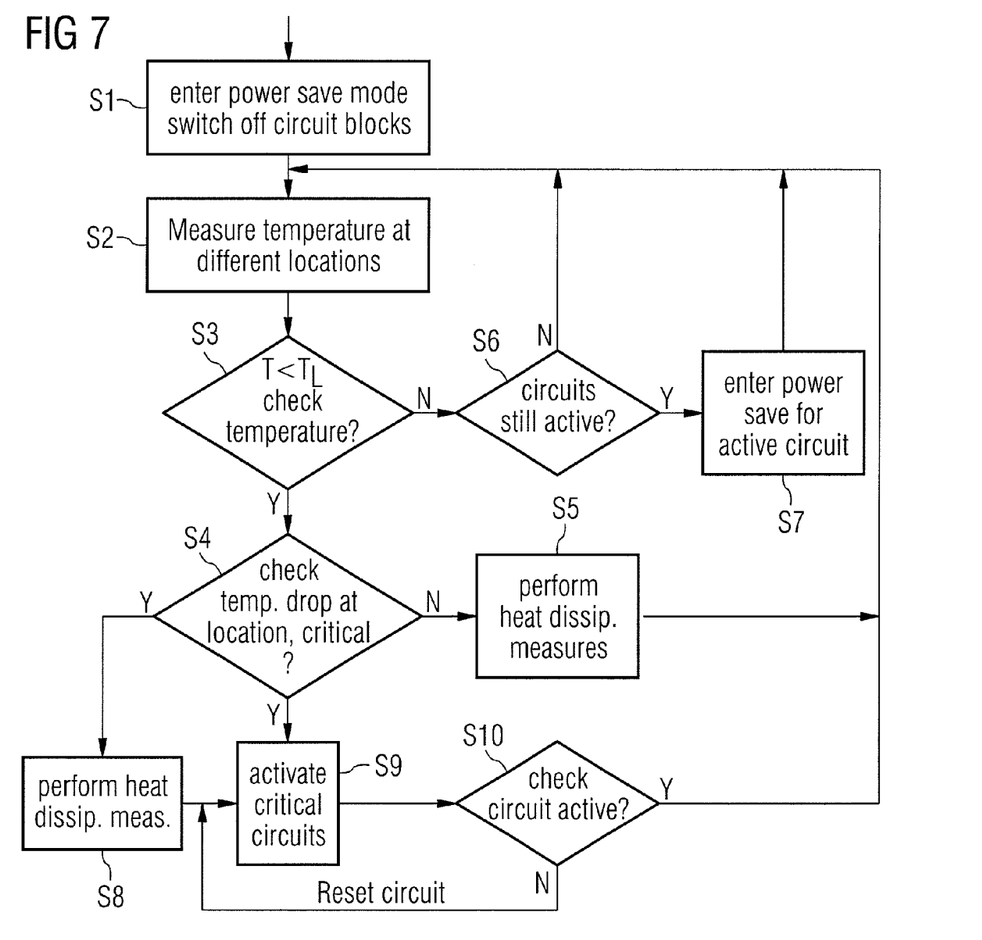
FIG. 7 illustrates an embodiment of a method for determining and controlling the temperature of an integrated memory device.

FIG. 7 illustrates an embodiment of a temperature control method for an integrated memory device or any other integrated circuit. During operation, some power-save mode is entered to reduce the overall power consumption. Such power save mode is convenient to lengthen the lifetime of a battery in mobile device, but also to prevent overheating due to continuous heat dissipation.

Power consumption is achieved in step S1 by switching off or deactivating some circuitry and/or circuit blocks not required for the current mode of operation if the device. For example, the column and row decoder as well as some generator circuits in an integrated memory device can be deactivated when no read or write access is required. It is also possible not to switch-off the circuitry completely but simply to reduce the supply voltage or current.

In step S2, the temperature of the semiconductor body is measured. The measurement can be performed at different sections within the semiconductor body to get a more detailed view about the temperature distribution of the semiconductor substrate. The temperature can also be measured close to circuitry which is currently deactivated. Of course, the temperature can also be measured at a single section on which, for example, temperature sensitive circuits are arranged. The signal corresponding to the measured temperature is then compared to a threshold value in step S3. The threshold value corresponds to a minimum low temperature on which a normal operation for the different circuits and circuit blocks is guaranteed or at least very probable.

If the measured temperature is not below a low threshold temperature, it will be checked whether some sub-circuits, circuitry or even circuit blocks are still active, which can be deactivated. If this is not the case, the method is repeated with step S2. If some circuits are still active, but not required these circuits can be deactivated entering an additional power-down and power-save mode in step S7. The consumption of the integrated memory device as well as heat dissipation is further reduced. The procedure is then repeated with step S2 and the temperature at different locations is measured again.

If the temperature measured in step S2 is below a threshold temperature TL, it will be checked whether the temperature drop is at a critical location. Such critical location may be, for example, close to a sub-circuit or a circuit block within the semiconductor body, which is very required for different operation modes. Such sub-circuits or circuit block may include an internal voltage generator providing internal supply voltages, oscillators for generating clock signals and pump circuits. If the low temperature is not in a critical section or if it is not considered necessary to take specific measures, the method is continued with step S5. Heat is produced, for which several and different measures can be used. These measures may include reactivating some specific circuitry blocks from sleep-mode, a refresh cycle of the memory banks of the integrated memory device, reactivating of some sense amplifiers and output drivers, or reactivating additional heat resistors. All these measures provide some heat and increase the overall temperature of the semiconductor body. After performing the measures, the temperature is measured again in step S2.

Depending on the temperature check in step S3 and the determining of the section within the semiconductor body with low temperature in step S4, different other procedures are possible. In an alternative, the method continues with step S8 performing some additional heat dissipation measures. These measures can be similar or equal to the heat dissipation measures as indicated in step S5. For instance, some heat resistors may be activated before reactivating the circuitry or circuit block in step S9 to prevent a boot failure of the reactivated circuit.

Alternatively, the circuitry or circuit block can be reactivated directly in step S9, thereby also dissipating some heat and increasing the temperature. In step S10, it will be checked, whether the reactivation procedure of step S9 has been successful. If the activated circuit block provides a failure signal, the circuit block can be reset and the reactivation procedure of step S9 repeated. It is also possible in step S10 to wait for a specific time for a power-up ready signal. If the signal is not received after a specific time, the circuitry or circuit block to be activated is reset again and the reactivation procedure repeated. For this purpose, the internal power supply can be separated from the circuit to be activated. Due to the first failed reactivation sequence, some heat was generated and the temperature increased. Consequently, a new reactivation procedure may result in a correct reactivation of the circuitry or circuit block. If the circuitry or block in step S9 is activated correctly, the method is repeated with step S2.

Figure 8:
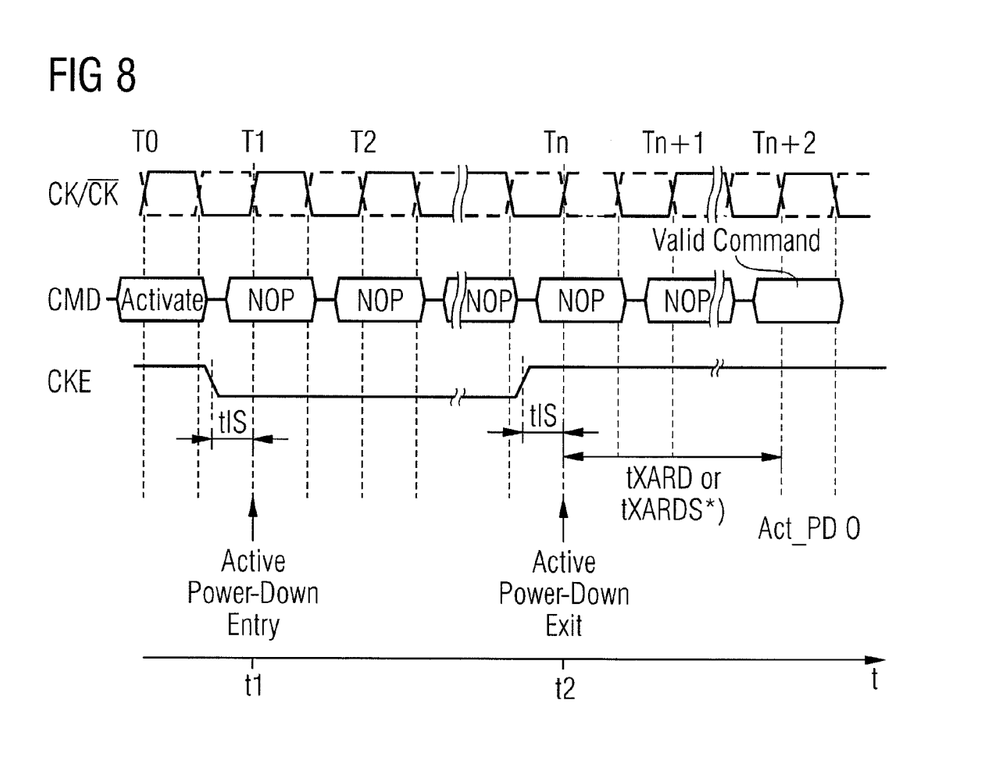
FIG. 8 illustrates various control and command signals over time applied to an integrated memory device.

FIG. 8 shows some signals over time for the operation mode "active power-down" having a low power consumption of an integrated memory device due to deactivation of some not required circuitry of a memory device. The clock signal CK is active the whole time as well as the command signal CMD. The mode "active power-down" starts at time t1 indicated by a transition of signal CKE to low level and NOP (no operation) by the command signal CMD. With the low level of the signal CKE, some sub-circuits or circuit blocks not required for this mode of operation will be deactivated. For example, the sub-circuits and circuit blocks are separated from the supply voltage and current. The overall power consumption is thereby reduced and the temperature of the semiconductor body decreases to approach the environment temperature.

At time frame Tn, the signal CKE switches from low level to high level indicating the end of the power save mode "active power-down". At the same time t2, the deactivated circuitry receives a corresponding reactivation signal. During the time tXRAD (or tXARDS), the deactivated circuits are reactivated and reach their operation mode before time frame Tn+2. At this time frame, a valid command can be set by the signal CMD.

Figure 9:
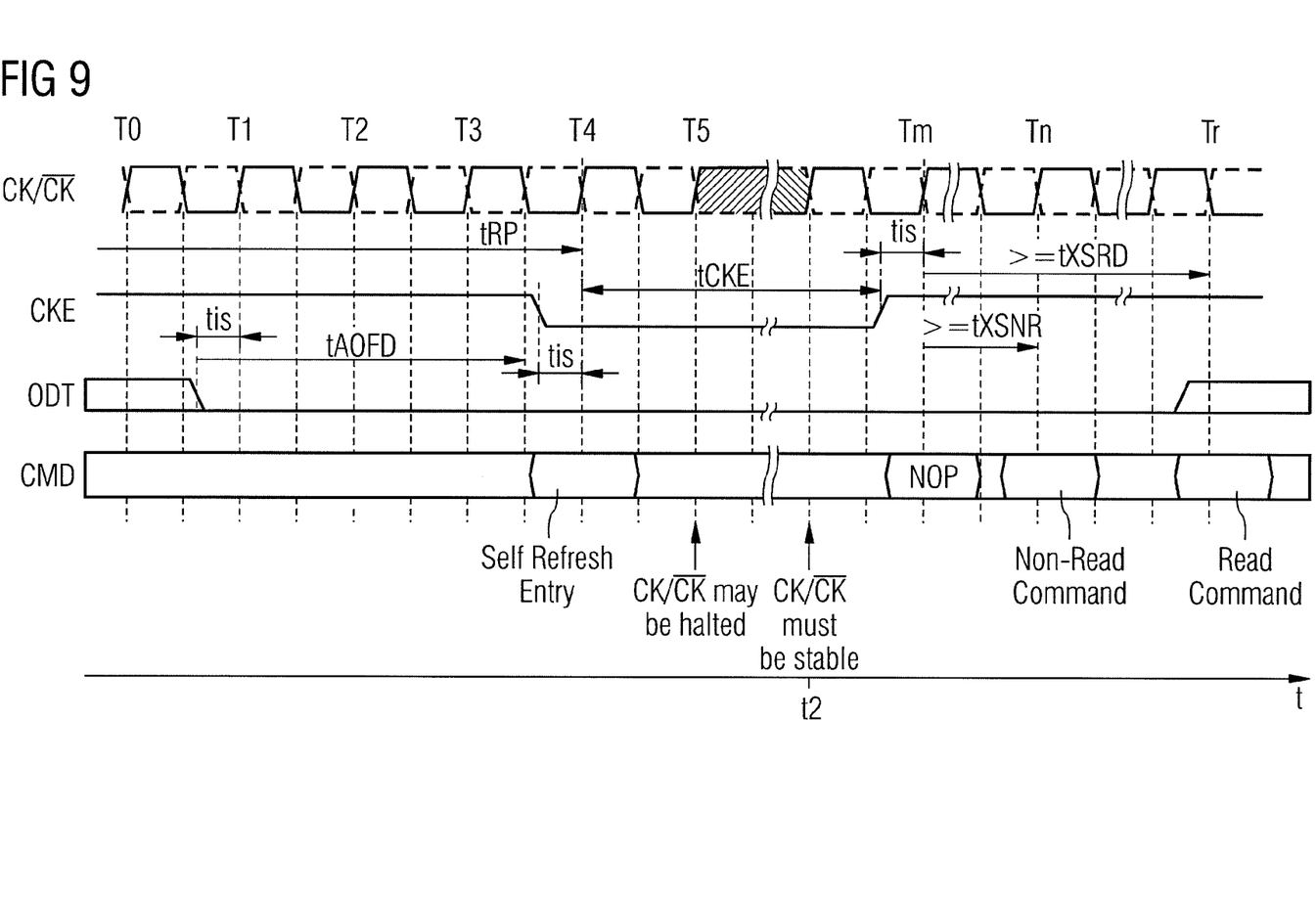
FIG. 9 shows various control and command signals over time applied to an integrated memory device.

FIG. 9 illustrates a further embodiment comprising some control and command signals of an integrated memory device over time for a different power saving mode of operation. After four cycles of the clock signal CK, the command signal CMD comprises a self-refresh entry and the memory cells of the integrated memory device are self-refreshed. During the self-refresh, the signal CKE switches to low level indicating a power save mode. After deactivation of some circuitry, a second power save mode is entered by halting the clock signal. The clock generation circuitry is deactivated.

To perform a different operation, for example, a read, write or self-refresh operation, the clock generation circuitry has to be reactivated again. To ensure the different operations, the temperature is measured and compared to a threshold value. If the temperature drops below the threshold value, heat dissipating measures are taken in a section of the semiconductor body close to the clock generation circuitry. These measures may include a temporal reactivation of the clock generation circuitry to produce and dissipate heat. After some time, before the signal CKE raises to high level, the memory device leaves the second power save mode and clock generation circuitry is reactivated completely. At t2 the clock generation must be stable to ensure a proper and correct reactivation of the other deactivated circuitry. After the transition of signal CKE to high level, all other circuitry is reactivated. When all circuits indicate a proper operation, command signals are applied on the command line.

Figure 10:
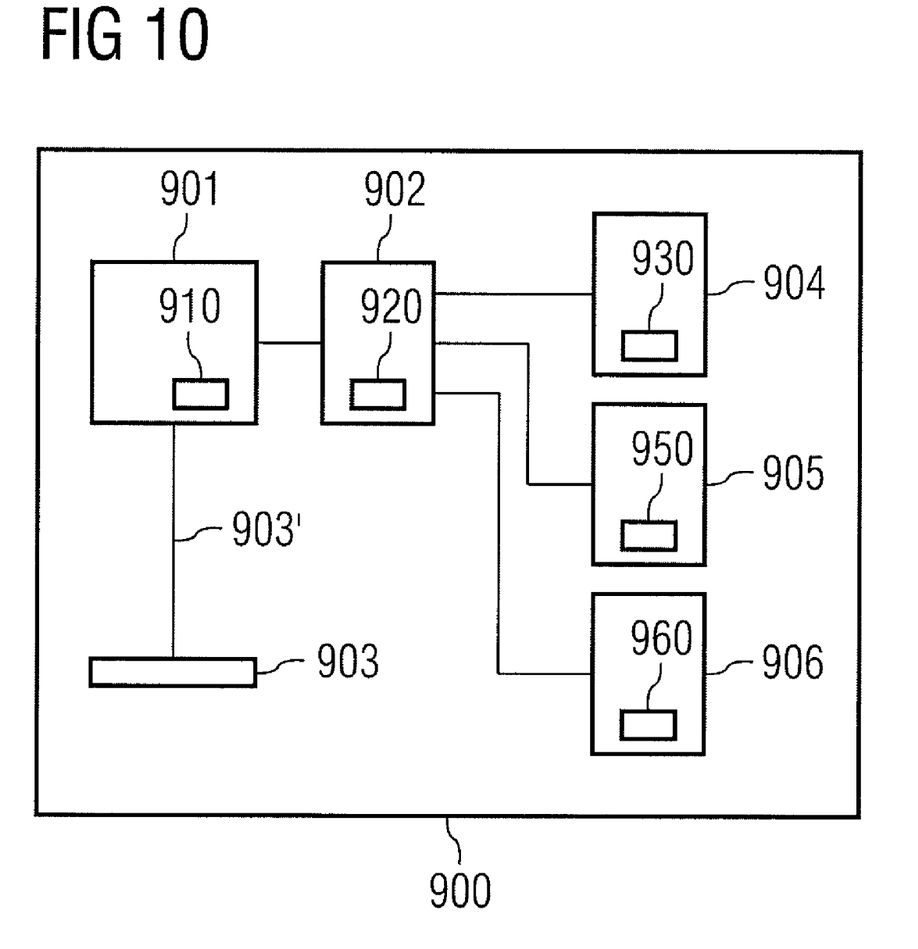
FIG. 10 shows a schematic illustration of an embodiment of a computer system with a main processor and a semiconductor memory.

FIG. 10 shows a computer system having a main processor 901 unit, a memory controller 902 and one or a plurality of memory modules 904 to 906. Each of the memory modules may comprise a DRAM, SDRAM, DDR-RAM or any other memory type. The memory modules may comprise a single memory chip per module or a plurality of semiconductor memory chips on each module. The processor 901 is connected to the memory controller 902 requesting read or write access to the memory modules 904 to 906. The processor may also communicate with some external connection 903 via bus connection 903'.

The semiconductor memory on the memory modules comprises one or a plurality of temperature sensors arranged on the respective chips and a control logic connected thereto. The control logic evaluates the signals provided by the respective temperature sensors. Based on the results, the control logic reactivates some formerly deactivated sub-circuits to dissipate heat. Similar temperature sensors and control logic 901, 920 are arranged in the main processor 901 and the memory controller 902. If the processor switches to a "sleep"-mode, the control logic ensures a correct and full reactivation from the "sleep"-mode. Consequently, the system can be used even in cold environments. The computer system according to FIG. 10 can be an embedded system. It can be used in different applications and devices like for example, a digital camera or camcorder, a mp3-player or any other kind of music player, a mobile cd-player or DVD-player, a mobile communication device, a notebook, a palmtop, a mobile storage device and the like.

While specific embodiments have been described in detail in the foregoing description and illustrated in the accompanying drawings, one of ordinary skill in the art will appreciate that various modifications and alternatives to those details can be developed in the light of the overall teaching of the disclosure. It is to be understood that other embodiments may be utilized and structural or logical changes may be made without departing from the scope of the invention. The elements of the drawings are not necessarily to scale relative to each other. The application is intended to cover any variations of the invention. The scope of the invention should therefore be determined with reference to the appended claims along with the scope of equivalence to which such claims are entitled. It is emphasized that the abstract is provided to comply with the formal requirements of 37 CFR §1.72(b) requiring an abstract that will allow the reader to quickly ascertain the nature and gist of a technical disclosure. It is submitted with the understanding that it will not be used to interpret or limit the scope of the meaning of the claims.

What is claimed is:

1. A memory device in a semiconductor substrate comprising:
   a semiconductor substrate;
   at least one temperature sensor to generate a temperature dependent signal;
   at least one circuit operable to produce heat in response to a control signal; and
   a control circuit coupled to the at least one circuit, the control circuit being operable to generate the control signal in response to the temperature dependent signal, wherein the control circuit generates the control signal in the event that a temperature drop indicated by the temperature dependent signal is determined to be below a threshold temperature value.

2. The memory device according to claim 1, wherein the control circuit comprises a comparator to compare the temperature dependent signal with a reference signal.

3. The memory device according to claim 1, wherein the at least one circuit comprises a further circuit having at least a first mode of operation for operating the memory device.

4. The memory device according to claim 1, wherein the at least one circuit comprises a voltage generator circuit operable to generate a supply signal for at least one mode of operation of the memory device.

5. The memory device according to claim 1, wherein the at least one circuit comprises a pump voltage circuit operable to generate a voltage signal for at least one mode of operation of the memory device.

6. The memory device according to claim 1, wherein the at least one circuit comprises a voltage regulator operable to generate a regulated voltage signal for at least one mode of operation of the memory device.

7. The memory device according to claim 1, wherein the at least one circuit comprises a word or bit line decoder for at least one mode of operation of the memory device.

8. The memory device according to claim 1, wherein the at least one circuit comprises a signal amplifier circuit for at least one mode of operation of the memory device.

9. The memory device according to claim 1, wherein the at least one circuit comprises an oscillator circuit operable to generate a clock signal for at least one mode of operation of the memory device.

10. The memory device according to claim 1, wherein the at least one temperature sensor is disposed in a section of the semiconductor substrate proximate to the at least one circuit.

11. The memory device according to claim 1, further comprising:
a clock generator circuit;
wherein the at least one temperature sensor is disposed in a section of the semiconductor substrate proximate the clock generator circuit.

12. The memory device according to claim 1, further comprising:
sense amplifier circuitry;
wherein the at least one temperature sensor is disposed in a section of the semiconductor substrate proximate the sense amplifier circuitry.

13. The memory device according to claim 1, wherein the at least one temperature sensor comprises a further circuit operable to generate a signal proportional to an absolute temperature.

14. The memory device according to claim 1, further comprising:
a further circuit;
a switch connected to the further circuit and arranged downstream to the at least one circuit;
wherein the switch is operable to prevent signals generated by the at least one circuit during a heat dissipation procedure from being applied to the further circuit in response to receiving the control signal of the control circuit.

15. A memory device in a semiconductor substrate comprising:
a semiconductor substrate;
at least one temperature sensor to generate a temperature dependent signal;
at least one circuit operable to produce heat in response to a control signal, wherein the at least one circuit comprises at least one heating resistor; and
a control circuit coupled to the at least one circuit, the control circuit being operable to generate the control signal in response to the temperature dependent signal.

16. A memory device in a semiconductor substrate comprising:
a semiconductor substrate;
at least one temperature sensor to generate a temperature dependent signal;
at least one circuit operable to produce heat in response to a control signal; and
a control circuit coupled to the at least one circuit, the control circuit being operable to generate the control signal in response to the temperature dependent signal, wherein the at least one temperature sensor is operable to generate a signal corresponding to a temperature difference.

17. A semiconductor memory device arranged in a semiconductor substrate, the semiconductor memory device comprising:
a semiconductor substrate;
at least one circuit with at least first and second modes of operation, the at least one circuit being operable to select a mode of operation in response to a control signal, wherein a power consumption of the at least one circuit in the second mode is reduced with respect to a power consumption of the at least one circuit in the first mode;
at least one temperature sensor operable to generate a temperature dependent signal; and
a control circuit coupled to the at least one circuit, the control circuit being operable to generate the control signal for selecting the first mode of operation in response to a temperature derived by the temperature dependent signal being lower than a threshold temperature.

18. The semiconductor memory according to claim 17, further comprising:
a clock generator circuit;
wherein the at least one temperature sensor is disposed in a section of the semiconductor substrate proximate to the clock generator circuit.

19. A computer system, comprising:
a main processor to process data; and
a semiconductor memory device as recited in claim 17, wherein the semiconductor memory device is coupled to the main processor.

20. The system according to claim 19, wherein the main processor comprises:
at least one circuit with at least first and second modes of operation, the at least one circuit being operable to select a mode of operation in response to a control signal, wherein a power consumption of the at least one circuit in the second mode is reduced with respect to a power consumption of the at least one circuit in the first mode;
at least one temperature sensor operable to generate a temperature dependent signal; and
a control circuit coupled to the at least one circuit, the control circuit being operable to generate the control signal for selecting the first mode of operation in response to a temperature derived by the temperature dependent signal being lower than a threshold temperature.

* * * * *